United States Patent Office 3,562,039
Patented Feb. 9, 1971

3,562,039

METHOD OF IMPROVING THE SOLDERABILITY OF CONDUCTOR PLATES

Josef Strohmayer, Hans-Hermann Merkenschlager, and August Stumbaum, Munich, Germany, assignors to Siemens Aktiengesellschaft, a corporation of Germany No Drawing. Filed Oct. 10, 1968, Ser. No. 776,298
Claims priority, application Germany, Oct. 11, 1967, P 16 21 516.0
Int. Cl. B23k *31/02*
U.S. Cl. 156—18 6 Claims

ABSTRACT OF THE DISCLOSURE

Through etching, preferably with etchable cupric ions, the solderability of electrical copper conductors can be considerably improved or restored.

The present invention relates to a method of improving the solderability of electrical conductor plates with conducting leads of copper or copper alloys.

Conductor plates are carefully cleaned prior to soldering to produce electrical terminals on conductor plates. The purifying techniques used for this purpose are those used in the galvanizing method. Furthermore, it is known to treat oxide layers on the conductor leads of copper or copper alloys for short periods with a dilute solution of sulphuric acid with sodium dichromate or with a solution of iron sulphate and ammonium persulphate. All these methods are primarily intended for the removal of oxide layers from the surfaces. This, as is known, may also be achieved by mechanical means such as sand blasting, scouring, polishing, brushing and even erasing with a special eraser. In addition to the purifying effect, these mechanical processing methods produce rough surfaces on the conductor leads, which promote wettability by the solder.

The mechanical treatment methods entail a number of serious disadvantages. In all these methods, it is extremely difficult to control the degree of metal removal from the surface of the conductor leads. Also, it is frequently impossible not to impair undesirably the surface of the carrier material. The grinding agents used in sandblasting, polishing, scouring and buffing may adhere on the conductor leads as well as on the hard to get to places in the carrier material and disturb the solder.

Conductor leads made of copper or copper alloys must be equipped and soldered as quickly as possible following their manufacture, since the solderability of said conductor plates decreases to such an extent, within a few weeks, that perfectly soldered connections are no longer obtainable if, for well known reasons, noncorrosive or only slightly corrosive fluxing agents are used for soldering.

In searching for surface processing methods which will ensure high and long lasting solderability of the conductor plates, we have discovered the method of the present invention. This method is characterized by subjecting the surface of the conductor leads, at least at the localities to be soldered, to an etching process and to an appropriate, known after treatment, to expose the surface. The etching process removes copper from the surface and the surface is roughened. The obtained degree of roughness and the fact that the use of this method results in highly pure copper surfaces, results in exceptionally good wettability by the solder.

The method of the present invention produces surfaces which possess a solderability much higher than that which can be obtained by the previously used above-described methods. The solderability of surfaces treated according to our invention lasts for several months without a considerable decrease in the solderability. Furthermore, conductor plates which, immediately following their processing, were coated with a colophonium or rosin solder varnish possess good solderability even after a one-year storage period. Also surfaces which no longer had any solderability were reactivated by the method of the present invention.

Other tests have shown that an etching solution comprised of cupric chloride, hydrochloric acid and ammonium chloride is particularly suitable for increasing solderability. The concentration of the etching solution is preferably so adjusted that the operational temperature of the bath will not exceed the solubility product. At room temperature, the following concentrations, for example, were found to be favorable:

(a) cupric chloride 0.5–2.5 mol per liter
(b) ammonium chloride 2.5–0.5 mol per liter
(c) hydrochloric acid 0.2–0.6 mol per liter whereby the sum of the concentration is to amount to approximately 3 mol per liter. An etching solution of 0.9 to 1.1 mol per liter cupric chloride, 1.5 mol per liter ammonium chloride and 0.6 to 0.4 mol per liter hydrochloric acid is considered particularly suitable, within the above concentration range.

In an embodiment example of the method, the conductor plate was dipped for a short while into the just described preferred etching solution and thereafter rinsed carefully with tap water. Following a short scouring period in 12% hydrochloric acid, the conductor plate was again rinsed with tap water and was neutralized by being dipped in a 3% ammonia solution, whereupon it is rinsed once again with tap water.

At the end of the treatment, the conductor plate was rinsed with desalinated (distilled) water and air-dried.

The copper plate was readily solderable and maintained its solderability for a period of 3 months. When coated with colophon, the plate maintained good solderability for a period of 1 year. When copper plates, which had lost their solderability through age, were treated as above, they regained their solderability and maintained the same for a period of 3 months when uncoated and a period of 1 year when colophon coated.

We claim:

1. A method of improving the solderability of electrical conductor plates to conductor leads of copper or copper alloys, which comprises etching the surface of the conductors, at least at those localities to be soldered, with an etching solution consisting essentially of cupric chloride, hydrochloric acid and ammonium chloride and thereafter disposing the etched conductor into an aqueous hydrochloric acid solution to expose the surface.

2. The method of claim 1, wherein the concentrations of cupric chloride, ammonium chloride and hydrochloric acid in the etching solution are such that the solubility of none is exceeded at the operational temperature.

3. The method of claim 2, wherein the concentration of the chlorides in the etching solution at room temperature is:

(a) cupric chloride 0.5–2.5 mol per liter
(b) ammonium chloride 2.5–0.5 mol per liter
(c) hydrochloric acid 0.2–0.6 mol per liter.

4. The method of claim 3, wherein the etching solution contains 0.9 to 1.1 mol per liter cupric chloride, 1.5 mol per liter ammonium chloride and 0.6 to 0.4 mol per liter hydrochloric acid.

5. The method of claim 4, which comprises:

(a) dipping in an etching solution of claim 4 and rinsing with tap water
(b) washing in approximately 12% hydrochloric acid and rinsing with tap water (c) dipping in an approximately 3% ammonia solution and rinsing with tap water
(d) rinsing in desalinated water and
(e) air-drying.

6. The method of claim 5, wherein the surface is additionally coated with a soldering varnish.

References Cited

UNITED STATES PATENTS 2,365,539 12/1944 Flowers ----------- 29—488X
2,878,146 3/1959 Certa ---------------- 134—41
2,908,557 10/1959 Black et al. -------- 252—79.2X JOHN T. GOOLKASIAN, Primary Examiner J. C. GIL, Assistant Examiner U.S. Cl. X.R.

29—488; 117—49, 213; 134—3, 28, 41; 156—20; 252—79.1, 79.2